United States Patent
Ku et al.

(10) Patent No.: US 7,404,123 B1
(45) Date of Patent: Jul. 22, 2008

(54) AUTOMATED TEST AND CHARACTERIZATION DATA ANALYSIS METHODS AND ARRANGEMENT

(75) Inventors: Tina Pai-Lin Ku, Hayward, CA (US); Paul Ronald Ballintine, Pleasanton, CA (US); Gean Hsu, Fremont, CA (US); Jaime Sarmiento, Tracy, CA (US)

(73) Assignee: Lam Research Corporation, Fremont, CA (US)

( * ) Notice: Subject to any disclaimer, the term of this patent is extended or adjusted under 35 U.S.C. 154(b) by 161 days.

(21) Appl. No.: 11/462,325

(22) Filed: Aug. 3, 2006

Related U.S. Application Data

(63) Continuation-in-part of application No. 11/093,094, filed on Mar. 28, 2005.

(51) Int. Cl.
G01R 31/28 (2006.01)
G06F 11/00 (2006.01)

(52) U.S. Cl. .................................. 714/724; 714/25
(58) Field of Classification Search ................ None
See application file for complete search history.

(56) References Cited

U.S. PATENT DOCUMENTS

| | | | |
|---|---|---|---|
| 6,662,217 B1 | 12/2003 | Godfrey et al. | |
| 7,016,946 B2 | 3/2006 | Shirriff | |
| 7,117,411 B2 * | 10/2006 | McNeely et al. | ............. 714/724 |
| 7,165,189 B1 * | 1/2007 | Lakkapragada et al. | ....... 714/31 |
| 2002/0162059 A1 | 10/2002 | McNeely et al. | |
| 2005/0138113 A1 * | 6/2005 | Brendle et al. | ............. 709/203 |

OTHER PUBLICATIONS

"International Search Report", Issue in PCT Application No. PCT/US2007/75213; Mailing Date.; Apr. 7, 2008.
"Written Opinion", Issue in PCT Application No. PCT/US2007/75213; Mailing Date.; Apr. 7, 2008.

* cited by examiner

*Primary Examiner*—Christine T Tu
(74) *Attorney, Agent, or Firm*—IP Strategy Group, P.C.

(57) ABSTRACT

A method for testing a component configured to be installed in a plasma processing system. The method includes providing an ATAC (Automated Test and Characterization) fixture, which includes a system control software package (SCS) that is representative of production system control software, a data manager module configured to obtain specification data from a database over a computer network, a test manager module configured to execute a set of tests designed to test the component, a SCS interface engine configured to provide the set of tests to the SCS, and a data analysis module configured to provide computer-implemented data analysis tool for analyzing test data obtained from the testing the component. The method also includes coupling the ATAC fixture to the component to enable the SCS in the ATAC fixture to test the component utilizing the set of tests and at least a portion of the specification data.

23 Claims, 10 Drawing Sheets

| Component | Test Fixtures | Data Logging | Reporting and Access | Control Logic |
|---|---|---|---|---|
| Process Module 102 | LamWorks | SQL | Internal Intranet Paper Printout | Different than Target Control System |
| Component 106 | LamWorks | SQL | Internal Intranet PDF format | Different than Target Control System |
| Component 108 | LabView | SQL | Paper Printout | Different than Target Control System |
| Transfer Module 111 | None | Hand-written report | PDF format | Different than Target Control System |

FIG. 1B (Prior Art)

AUTOMATED TEST AND CHARACTERIZATION DATA ANALYSIS METHODS AND ARRANGEMENT

CROSS-REFERENCE TO RELATED APPLICATIONS

This application is a continuation-in-part of and claims priority under 35 USC 120 to a patent application entitled "Automated Test and Characterization for Web Services," by Ku et al., application Ser. No. 11/093,094 filed on Mar. 28, 2005, which is incorporated herein by reference.

BACKGROUND OF THE INVENTION

Advances in plasma processing have provided for growth in the semiconductor industry. Before a plasma processing system (such as a plasma cluster tool) is set up at a customer's site, a series of quality control tests may be performed. Data from these quality control tests may be collected and stored for future analysis.

Generally, a multitude of quality control tests may be performed on the plasma cluster tool and its various components before the plasma cluster tool is sent to a customer from a manufacturer. As discussed herein, a plasma cluster tool refers to a plasma processing system that may have a plurality of modules (e.g., processing module, transfer module, etc.) and may have a plurality of subsystems (e.g., RF match, gas box, TCP match, bias match, etc.). For ease of discussion, the term "component" will be used to refer to an atomic or a multi-part assembly in a plasma cluster tool. Thus, a component may be as simple as a gas line or may be as complex as the entire process module. A multi-part component (such as a process module) may be formed from other multi-part components (such as a vacuum system, a gas system, a power supply system, etc), which may in turn be formed from other multi-part or atomic components.

The various components of a plasma cluster tool may be manufactured by more than one party. For example, a manufacturer of plasma cluster tool, such as Lam Research Corporation of Fremont, Calif., typically utilizes components from a number of third-party suppliers in the manufacturing of a plasma cluster tool. In fact, such practice is standard in the semiconductor processing equipment field since it permits companies to focus on their strengths while delegating tasks outside of their fields of interest or expertise to other companies.

Currently, a standard testing framework for components does not exist. The tests may be performed by the manufacturer and/or by a third-party. Tests performed internally allow the manufacturer some control on the testing methodology. However, tests that may have been outsourced to a third-party give the manufacturer limited or no control over the tests that are being performed.

To facilitate discussion, FIG. 1A shows an example of a plasma cluster tool with a process module 102 and a transfer module 111. Within process module 102 are components 106 and 108 (e.g., gas box and RF match). Attached to process module 102 is a test fixture 112 (e.g., LamWorks), which may enable the entire process module 102 to be tested. Additional test fixtures (e.g., LamWorks-based test fixture 104 and Nyker Labview test fixture 110) are attached to components 106 and 108.

As discussed herein, a test fixture refers to hardware with a software interface that allows a component to be tested in a simulated processing environment. For example, a test fixture for an AC/DC box may enable the tester to test the wiring connection, the power components, etc. In some instances, a test fixture may not exist for a component. In FIG. 1A, a test fixture is not available for transfer module 111. Thus, testing transfer module 111 may have to be performed manually using paper procedures. With paper procedures, the quality of the test may be dependent upon a tester's skills and discretion. Furthermore, the procedures may be subjected to the tester's interpretation. In some cases, a tester may not always perform all steps completely. In other cases, a tester may fabricate data. Thus, test results may be inconsistent and lack integrity.

FIG. 1B shows a chart of the components in FIG. 1A and the testing architecture associated with these components. For process module 102, test fixture 112 (e.g., LamWorks) produced internally by the manufacturer is attached. Tests that are performed using test fixtures created by the manufacturer may allow the manufacturer some control of the testing methodology that may be used. In an example, the manufacturer may be able to determine the control logic that each test fixture may employ in testing the components. Further, since each test fixture may be able to log and store the data (e.g., in a SQL database) on the test fixture, the manufacturer may have access to the electronic version of the data that are gathered, thus enabling the manufacturer the ability to manipulate the data for analysis. However, the reporting, or access to the report, may be limited to an intranet or a paper printout.

In another example, test fixture 106 (e.g., LamWorks) attached to component 106 (e.g., RF Match) is internally created but may have been sent off-site to a third-party to test the component. Even though the manufacturer may provide the test fixtures, the manufacturer generally may have limited or no control over the tests that may be performed off-site by the third party. Further, the manufacturer may be unable to readily access the test data for tests performed off-site. Instead, the manufacturer may only receive paper printouts or image copies of the test data.

In some situations, testing may be performed utilizing test fixtures that may have been created by third-party suppliers. In an example, test fixture 110 (e.g., Nyker using LabView) attached to component 108 (e.g., gas box) may be created by a third-party. Since the test fixtures are created by a third party, the manufacturers may not have control over the control logic that may be employed for the test fixtures. In these situations, the manufacturers are usually dependent upon the testers using test fixtures created by third-party suppliers to perform good tests and collect relevant data on the components. Further, the manufacturers may usually have limited access to the test data performed off-site, especially if the data is provided to the manufacturer in a paper or image format. As a result, the manufacturer may experience difficulties manipulating the data for analysis.

Generally, the control system may employ different control logic during the testing and production environment. As a result, the test environment may be unable to replicate what may happen in the production environment. For example, it is not unusual for changes to be occurring in the control system as a plasma cluster tool is being manufactured. However, the changes may not always be propagated to all the testers. As a result, the testers may not have all the data to create an environment that resembles the production environment. Further, there may have been changes in the various components, but the manufacturer may not have been informed to accommodate the changes. As a result, changes may unnoticeable until the plasma cluster tool is in the field.

In some cases, a component, such as transfer module 111, may not have a test fixture associated with the component. In situations where there are no test fixtures, the tester may have to rely on paper procedures to perform tests on a component. The test methodology for this situation is usually dependent upon the skill and knowledge of the tester. Furthermore, the procedures may be subjected to interpretation by the tester. Also, the tester may not always perform all steps completely. Thus, the data collected may be dependent upon the discretion of the tester. For example, the tester may choose not to perform a thorough test (such as skipping some of the steps) or the tester may choose to bypass the test and fabricate the data. Thus, test results may be inconsistent and may lack integrity. Manufacturers may have difficulties validating the accuracy of the test data, especially since the test data may be stored on paper.

Since a wide range of test methodologies may be employed, manufacturers may be unable to provide their customers with the assurance that consistent quality has been employed in testing the plasma cluster tools and components. Given the lack of testing standards, the data that may be gathered may differ in substance and quality depending upon the testing methodology and the tester. Also, an integrated test is not possible since a tester is usually limited to the component he/she is testing. Further, the reports that are produced from the testing may vary by format and substance. In an example, manufacturers may have access to the electronic test data if the testing is done internally. In another example, manufacturers may only have access to paper copy or an image copy of the test data if the testing is done off-site.

Given that test data may not be in a format that can be easily manipulated for data analysis, manufacturers may not have the resources or time available to dedicate to analyzing test data. Thus, unless a problem is obvious, test data may not be analyzed unless a problem arises in the production environment. Even then, the lack of effective tools to analyze the data may make debugging a problem an overwhelming task and traceability a challenge.

SUMMARY OF INVENTION

The invention relates, in an embodiment, to a method for testing a first component configured to be installed in a plasma processing system that is controlled during production with a production system control software. The method includes providing an ATAC (Automated Test and Characterization) fixture. The ATAC fixture includes at least a first system control software package ("first SCS") that is representative of the production system control software. The ATAC fixture also includes at least a data manager module configured to obtain specification data from a first database over a computer network. The ATAC fixture further includes at least a test manager module configured to execute, using the first SCS, a set of tests designed to test the component. The ATAC fixture moreover includes at least a SCS interface engine configured to provide at least the set of tests to the first SCS. The ATAC fixture yet also includes at least a data analysis module configured to provide computer-implemented data analysis tool to a user for analyzing test data obtained from the testing the first component. The method also includes coupling the ATAC fixture to the first component to enable the first SCS in the ATAC fixture to test the first component utilizing the set of tests and at least a portion of the specification data. Missing components of the plasma processing system which are not present while testing the first component are stubbed out to simulate the missing components, thereby permitting the first component to be tested in a simulated environment using the first SCS as if the missing components are present while testing the first component.

In another embodiment, the invention relates to a test fixture configured for testing a first component that is configured to be installed in a plasma processing system that is controlled during production with a production system control software. The test fixture includes a first system control software package ("first SCS") that is representative of the production system control software. The test fixture also includes a data manager module configured to obtain specification data from a first database over a computer network. The test fixture further includes a test manager module configured to execute, using the first SCS, a set of tests designed to test the component. The test fixture moreover includes a SCS interface engine configured to provide at least the set of tests to the first SCS. The test fixture yet also includes a data analysis module configured to provide computer-implemented data analysis tool to a user for analyzing test data obtained from the testing the first component. The test fixture, when coupled to the first component, is configured to enable the first SCS in the test fixture to test the first component utilizing the set of tests and at least a portion of the specification data. Missing components of the production plasma processing system which are not present while testing the first component are stubbed out to simulate the missing components, thereby permitting the first component to be tested in a simulated environment using the first SCS as if the missing components are present while testing the first component.

In yet another embodiment, the invention relates to a method for testing a first component configured to be installed in a plasma processing system that is controlled during production with a production system control software. The method includes providing an ATAC (Automated Test and Characterization) fixture. The ATAC fixture being configured to simulate a plasma processing system such that the first component can be tested with a set of tests and specification data obtained by the ATAC fixture via a computer network from a database. The method also includes coupling the ATAC fixture to the first component to facilitate the testing of the first component. The method further includes testing the first component with the set of tests and the specification data. The method moreover includes analyzing test data obtained from the testing the first component using the ATAC fixture to detect a condition that triggers a notification. Missing components of the plasma processing system which are not present while testing the first component are stubbed out to simulate the missing components, thereby permitting the first component to be tested in a simulated environment.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1B shows a chart of the components in FIG. 1A and the testing architecture associated with these components.

DETAILED DESCRIPTION OF EMBODIMENTS

Figure 1A:
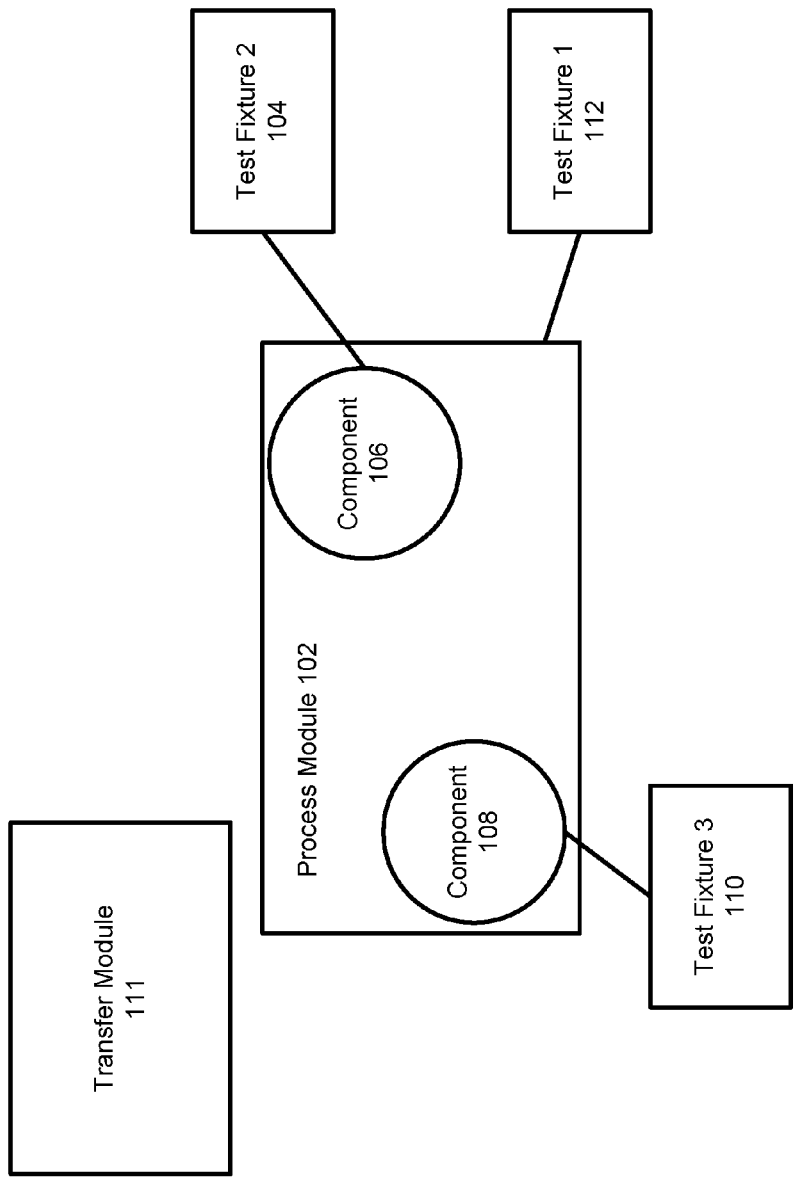
FIG. 1A shows an example of a plasma cluster tool with a process module and a transfer module to facilitate discussion.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the present invention, there is provided a testing arrangement that enables the standardization of test methodology and data collection for testing a plasma processing system, such as a plasma cluster tool. The test framework, or otherwise known as Automated Test and Characterization (ATAC) system, the system control software (SCS) and simulates the production environment. With the ATAC system, a manufacturer may maintain control of the testing methodology and specifications.

In this document, various implementations may be discussed using plasma cluster tool. This invention, however, is not limited to plasma cluster tool and may be employed with any plasma processing system.

Consider the situation wherein, for example, a plasma cluster tool and its various components are being tested. In an embodiment, a tester may employ the ATAC system to simulate production by stubbing out components that are not being tested. Since the test environment mirrors the production environment, testing is performed not only at the hardware level. Instead, the whole plasma cluster tool and its system control software (SCS) can be tested on an integrated basis. Further, in an embodiment of the invention, the ATAC system may transmit the data collected during the testing to the manufacturer system in a near real-time environment. As a result, the manufacturer may have ready access to the test data.

As mentioned before, the ATAC system is a testing arrangement for testing a plasma cluster tool and its components having SCS for controlling the plasma cluster tool during production. The ATAC system may include a data manager module for obtaining specification data (e.g., test methodology, test specifications and associated test specifications data) pertaining to a component of the plasma cluster tool. In this manner, testers for each type of components, irrespective of whether or not the testers are internal testers or work for third party vendors, may utilize the same specification data.

The data manager module may obtain the specification data by accessing a computer network. In an embodiment of the invention, the computer network represents the Internet and/or the manufacturer information technology infrastructure. In an embodiment, the data manager may be implemented within the net infrastructure, which is provided and/or maintained by Microsoft Corporation of Redmond, Wash. The same data manager may also transport the test result data and/or files from the test fixture to the manufacturer's central test data archive servers upon completion of the tests.

The ATAC system may also include a test manager module configured to execute a set of tests for testing a component. As discussed herein, a set of tests may include one or a multiple of tests. The set of tests may include test specification and associated test specification data downloaded by the data manager module. The number of tests executed may be determined by the tester. With a test manager module, the same testing methodology may be distributed to all the testers.

The ATAC system may also include a SCS interface engine configured to communicate the set of tests with the SCS of the plasma cluster tool. The SCS interface engine may process the commands that are coded in the test scripts and may issue commands to the SCS. In an embodiment of the invention, the SCS interface engine may be implemented using Smalltalk, an object-oriented programming language. Information regarding Smalltalk may be found at www.smalltalk.org. Test scripts may be written in plain text files consisting of commands following ATAC command syntax.

The data manager module, the test manager module, and the SCS interface engine may reside in a host computer, which may also contain the SCS for controlling the plasma cluster tool during production. These different parts may work together to create an environment for testing a component and gathering the test results. In an embodiment of the invention, the test results may be transferred (using an appropriate software and/or hardware component) to the manufacturer's test data archive servers via the computer network. The test results, stored on the archive servers, may be accessible to authorized personnel.

A plasma cluster tool may have many components. Some of the parts may be produced internally while other components may be outsourced to suppliers. The test framework that the testers, both internally and externally, use to test the components is the ATAC system. To perform a test on a component, the tester, regardless if the tester is internally or externally located, may hook an ATAC test fixture to the component being tested. An ATAC test fixture, as discussed herein, is a test fixture which has the ATAC system built into it. Once the component being tested is hooked to the ATAC test fixture, the tester may be able to access the manufacturer site and to indicate the component that is being tested. The other components that may be found in a plasma cluster tool may be stubbed out (e.g., simulated as though these components existed and are operational).

Correct test specifications and methodology are downloaded onto the ATAC system. Testing begins and data collected from the testing is unloaded onto the manufacturer test data archive servers (either on demand by the tester while the testing is being performed or all at once when the testing has been completed). The data is now readily available to the manufacturer, testers, and the suppliers for analysis. Furthermore, the data is also available to the field engineers and the customers when problems arise.

To analyze the plethora of data that may be collected during testing, a data analysis module may be connected to the manufacturer's central test data archive servers (e.g., ATAC collection database). The data analysis module may include a user interface with statistical process control (SPC) logic. By employing the user interface, users may query the test data stored on the ATAC collection database and create user-friendly reports. In an embodiment, a custom rules database may also be connected to the data analysis module allowing users to save configuration of reports and charts as template that may later be utilized to present instantaneous reports. Also, the custom rules database may include notification rules that allow a user to configure the conditions under which the user is notified by the system that changes have occurred in the test results.

Figure 2A:
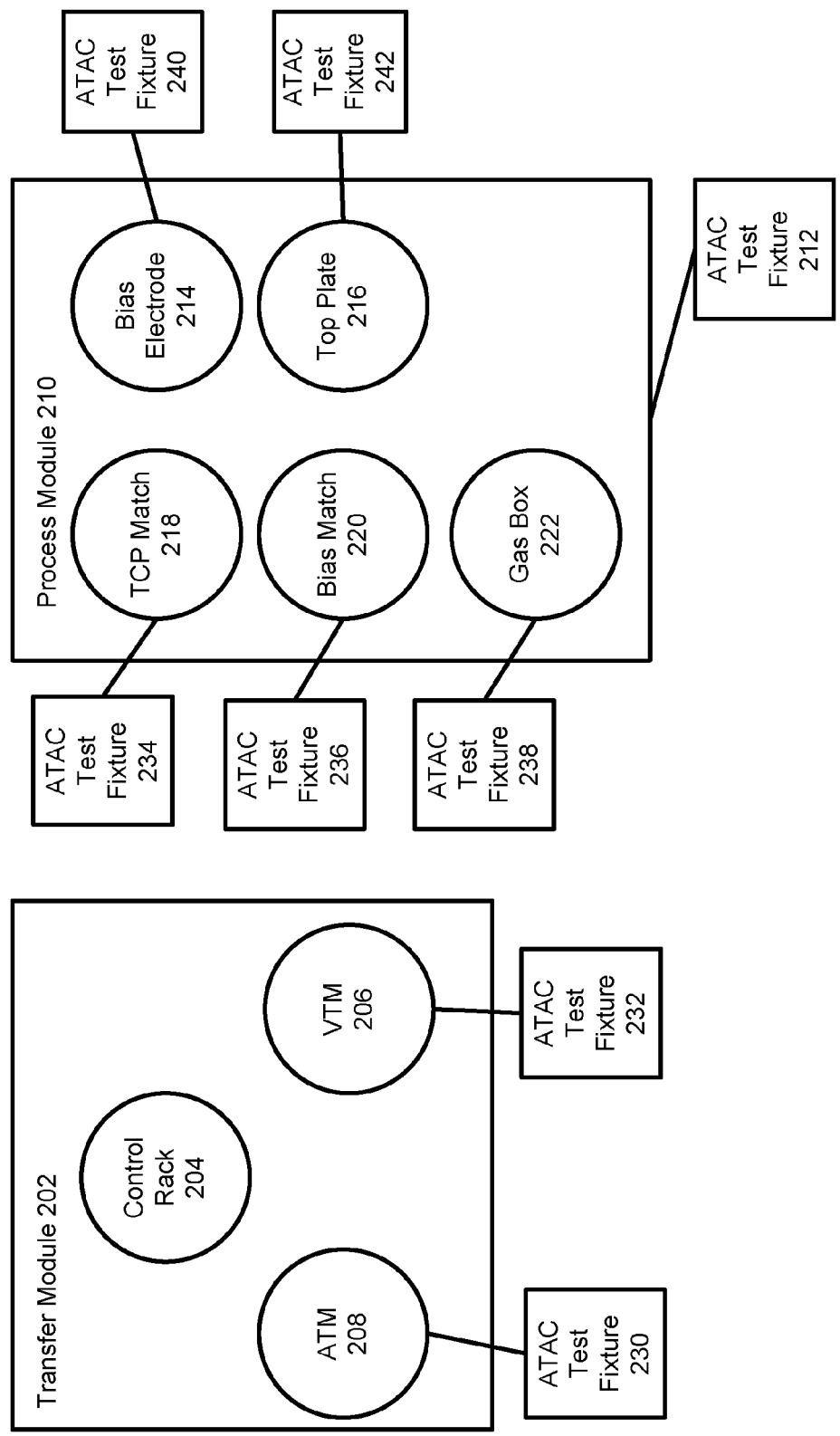
FIG. 2A shows, in an embodiment of the invention, a plasma cluster tool with attached ATAC test fixtures.

The features and advantages of the invention may be better understood with reference to the figures and discussions that follow. FIG. 2A shows an example of a plasma cluster tool with attached ATAC test fixtures. The plasma cluster tool shows a process module 210 and a transfer module 202. In transfer module 202 is a control rack 204, a vacuum transfer module (VTM) 206, and an atmospheric transfer module (ATM) 208. Attached to VTM 206 and ATM 208 are ATAC test fixtures 232 and 230, respectively. In this example, there is not shown an ATAC test fixture for control rack 204. Control rack 240 is where the control computer and the power distribution hardware reside. In an embodiment of the invention, an ATAC test fixture may exist for all components; however, components lacking sufficiently complex functionality and/or control logic (e.g., control rack) may not need an ATAC test fixture.

In process module 210, components that may exist include (but are not limited to) a TCP match 218 (with an ATAC test fixture 234), a bias match 220 (with an ATAC test fixture 236), a gas box 222 (with an ATAC test fixture 238), a bias electrode 214 (with an ATAC test fixture 240) and a top plate 216 (with an ATAC test fixture 242). There is also an ATAC test fixture 212 attached to process module 210. With the exception of the ATAC test fixtures, these and other major components of a cluster tool are well known to those skilled in the art. Thus, these major components will not be listed or discussed in details herein.

Figure 2B:
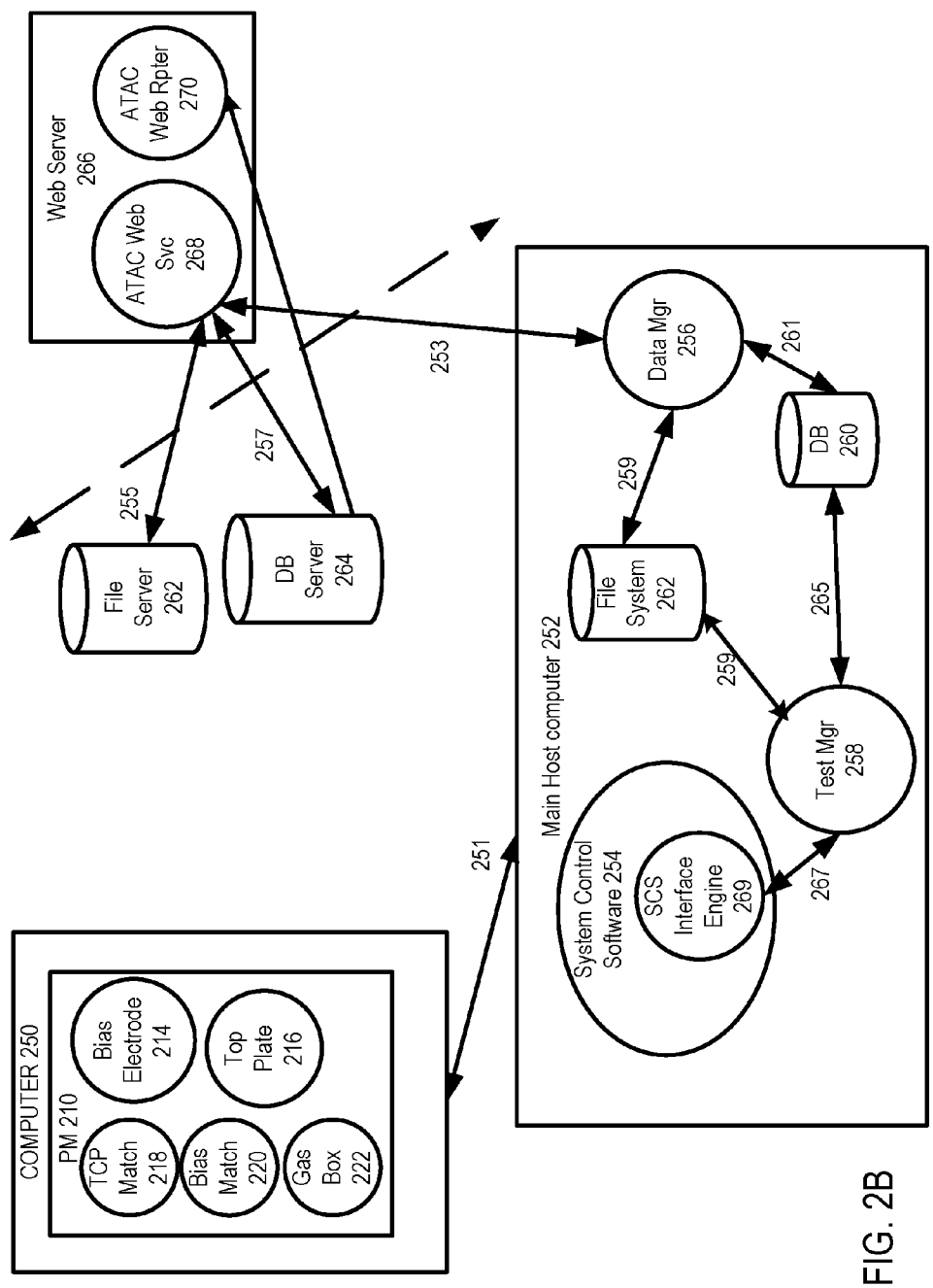
FIG. 2B shows, in an embodiment of the invention, the architecture of the ATAC test framework.

FIG. 2B shows, in an embodiment of the invention, the architecture of the ATAC test framework. A main host computer 252 has a system control software (SCS) 254 running on it. SCS 254 is the same system control software that is implemented for the plasma cluster tool in the production environment. As a result, tests are performed with the benefits of a simulated production environment.

Also residing on main host computer 252 is a data manager module 256. Data manager module 256 is a data transport agent that allows specification data to be loaded onto and result test data unloaded from main host computer 252 and the test data archive servers (e.g., web server 266) via path 253, which may be via the Internet. An ATAC web service 268, which resides on web server 266, implements a secure Internet environment. Thus, to gain access to ATAC web service 268, a user has to provide authentication data (e.g., user name and password).

If data manager module 256 wants to retrieve specification data from the manufacturer, a request may be made via path 253 to ATAC web service 268. ATAC web service 268 may retrieve the specification data from a file server 262 via path 255 and/or from a database server 264 via path 257. For example, recipes may be stored as a file on file server 262. On the other hand, minimal and maximum of capacitance may be stored on database 264. In an embodiment, file server 262 and database server 264 may reside on the manufacturer internal infrastructure. The specification data may be sent via path 253 to data manager module 256. Data manager module 256 may store the specification data in a file system 262 (via path 259) and a database 260 (via path 261). File system 262 and database 260 are located locally on main host computer 252.

Also residing on main host computer 252 is a test manager module 258. A tester may employ test manager module 258 to select a test scenario (e.g., perform a standard test, perform troubleshooting, perform diagnostic, etc.) for the component being tested. For each test scenario, there is a set of tests (e.g., testing functionality) that may be available. A set of tests may include one or more tests. The tester may choose to perform all or some of the tests. The test scenarios and set of tests are derived from the test specifications and associated test specification data that have been downloaded by data manager module 256 from ATAC web service 268 and stored in file system 262 and database 260. Test manager 258 may be implemented in Java™ (available from Sun Microsystems, Inc. of Mountain View, Calif.), in an embodiment.

Once the test sequence has been activated, test manager 258 may interact with a SCS interface engine 269 via path 267. SCS interface engine 269 may communicate the set of tests with SCS 254 of the plasma cluster tool. SCS interface engine 269 may process the commands that are coded in the test scripts and issues commands to SCS 254. In an embodiment of the invention, SCS interface engine 269 may be implemented using Smalltalk, an object-oriented programming language.

Test results may be gathered and saved on file system 262 and database 260. An example of test results that may be saved in file system 262 is a data log file. Examples of test results that may be saved in database 260 are the pressure measurements in a process module.

Test results may be unloaded to ATAC web services 268 immediately after a test has been performed, after a test scenario has been completed, or after all tests have been performed on the components. In an embodiment of the invention, test manager module 258 may be shut down when test results are unloaded onto ATAC web services 268. Test manager module 258 may be shut down to prevent potential data conflict. To unload the test results, data manager module 256 may retrieve the test results stored in file system 262 and database 260 and unload the test results to ATAC web service 268 which may store the test results in file server 262 and database server 264.

Tests results may be accessible as soon as the results are unloaded onto ATAC web services 268, and may be viewed using a data viewer (e.g., ATAC web reporter 270), a report application that may allow the user to view data and to create report. Users who have been granted authorized access may access the test results.

Figure 3:
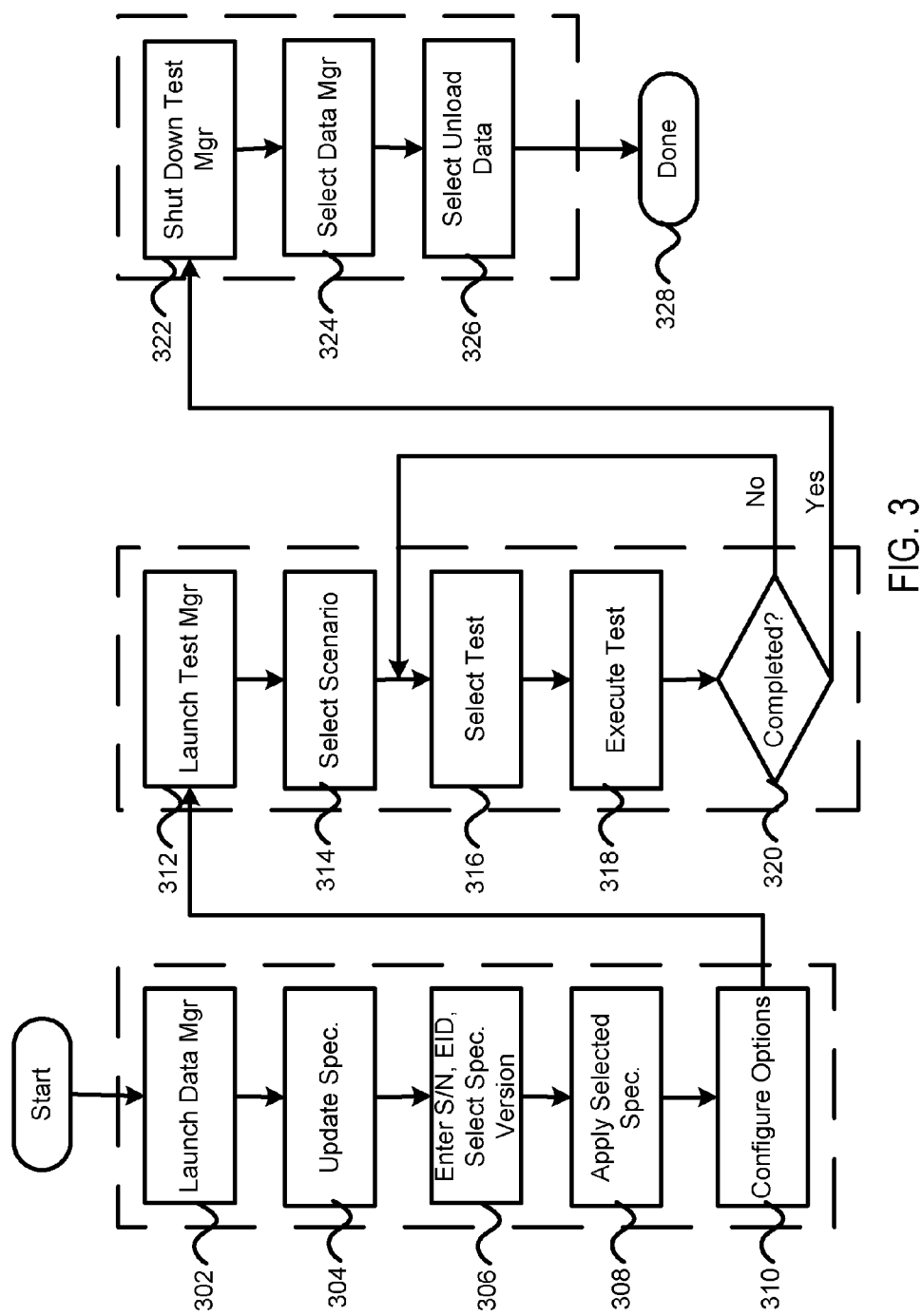
FIG. 3 shows, in an embodiment, a simplified flowchart for testing a component of a plasma cluster tool using the ATAC system.

FIG. 3 shows, in an embodiment, a simplified flowchart for testing a component of a plasma cluster tool using the ATAC system. FIG. 3 is discussed in relation to FIG. 2B. Consider the situation, for example, one of the components (such as bias electrode 214, TCP match 218, bias match 220, gas box 222, or top plate 216) in process module 210 may need to be tested. An ATAC test fixture may be connected to the component that needs to be tested. For example, main host computer 252 is connected to a computer 250 (e.g., VME), which controls process module 210 and its components. Once main host computer 252 with its built-in ATAC system is connected to computer 250, the ATAC system may provide the test frameworks and interface.

At a first step 302, a data manager module is launched. To begin testing the component, computer 250 may communicate with main host computer 252 via path 251 to initiate the testing process and launch data manager module 256.

At a next step 304, the tester pushes the button that enables the specification data to be updated. Data manager 256 may connect with the manufacturer's computer network (e.g., ATAC web service 264) and download all the specification data (e.g., different versions of the specification data in an embodiment). As mentioned before, access to the computer network (e.g., ATAC web service 264) may be granted once the tester provides authentication information (e.g., user name and password). In an embodiment, if testing of a component is performed multiple times, then in future downloads, only the differences of the specification data may be downloaded.

To download the specification data to data manager module 256, the computer network (e.g., ATAC web services 264) retrieves specification data from file server 262 and database server 264. Specification data that are retrieved from file server 262 and database server 264 may be downloaded to data manager module 256 and stored in file system 262 and database 260.

Once the specification data has been updated, the user may enter identification information about the component (e.g., serial number, equipment ID, etc.) and may choose the version of the specification data at a next step 306. At a next step 308, the selected version of the specification data may be applied by being copied to all the runtime directories. At a next step 310, the tester may configure the options that are specific to the component. For example, a gas box is configured based on how many gas lines it may have (e.g., 12 gas line), how many boxes it may have (e.g., 16 boxes), or the number of feed lines the gas box may have (e.g., dual gas feed or not).

At a next step 312, the tester may launch the test manager module to select the test scenario(s) (step 314). In an example, a tester wants to perform a standard set of tests on a gas box. Once a test scenario is chosen, the set of tests associated with the test scenario may be made available to the tester. At a next step 316, the tester may choose the tests to be executed. In an example, the standard set of tests on a gas box may include 40 tests that can be performed. Of those 40 tests, the tester may choose to execute all or just a select few. Test manager module 258 may utilize the specification data stored in file system 262 and in database 260 to select the test scenario and set of tests that will be executed.

At a next step 318, each test is executed. SCS interface engine 269 may communicate with test manager module 258 to retrieve the test sequence. SCS interface engine 269 may process the commands that are coded in the test scripts and may issue commands to SCS 254 to begin testing. Based on the information received, SCS 254 may stub out all components that are not being tested and initiates the testing sequence. In an embodiment of the invention, the SCS interface engine 269 may be implemented using Smalltalk, an object-oriented programming language.

The data gathered during each test may be sent via test manager module 258 to file system 262 and database 260. At a next step 320, if additional tests are desired, the tester may return to step 316 and select a new test. This process may continue until all tests that a tester wants to perform have been completed. Once all tests have been completed, the tester may shut down the test manager at a next step 322.

In an embodiment of the invention, test results may be unloaded onto ATAC web services 268 after the completion of a test or after the completion of a test scenario. For example, there are 40 tests being conducted for a test scenario. At the end of each test, the tester may shut down the test manager module to unload the data. When the tester re-launches the test manager module, the system may provide the tester with a status of each test and an opportunity to continue testing. As a result, the ability to unload test results more frequently may enable the tester and others who may be interested in the test results, a near-time access to the test results, which may allow analysis to be performed and troubleshooting to occur.

At a next step 324, data manager module may be activated to begin unloading data (step 326). For example, data manager module 256 may retrieve the test results from file system 262 and database 260 and may send the test results to ATAC web service 268. The test results may be stored at file server 262 and database server 264 and may be accessible to any user who is authorized to view the results (e.g., field engineers, suppliers, customers, etc.) At a next step 328, the testing is completed for the component and the tester may use ATAC web reporter 254 to view the data.

Figure 4:
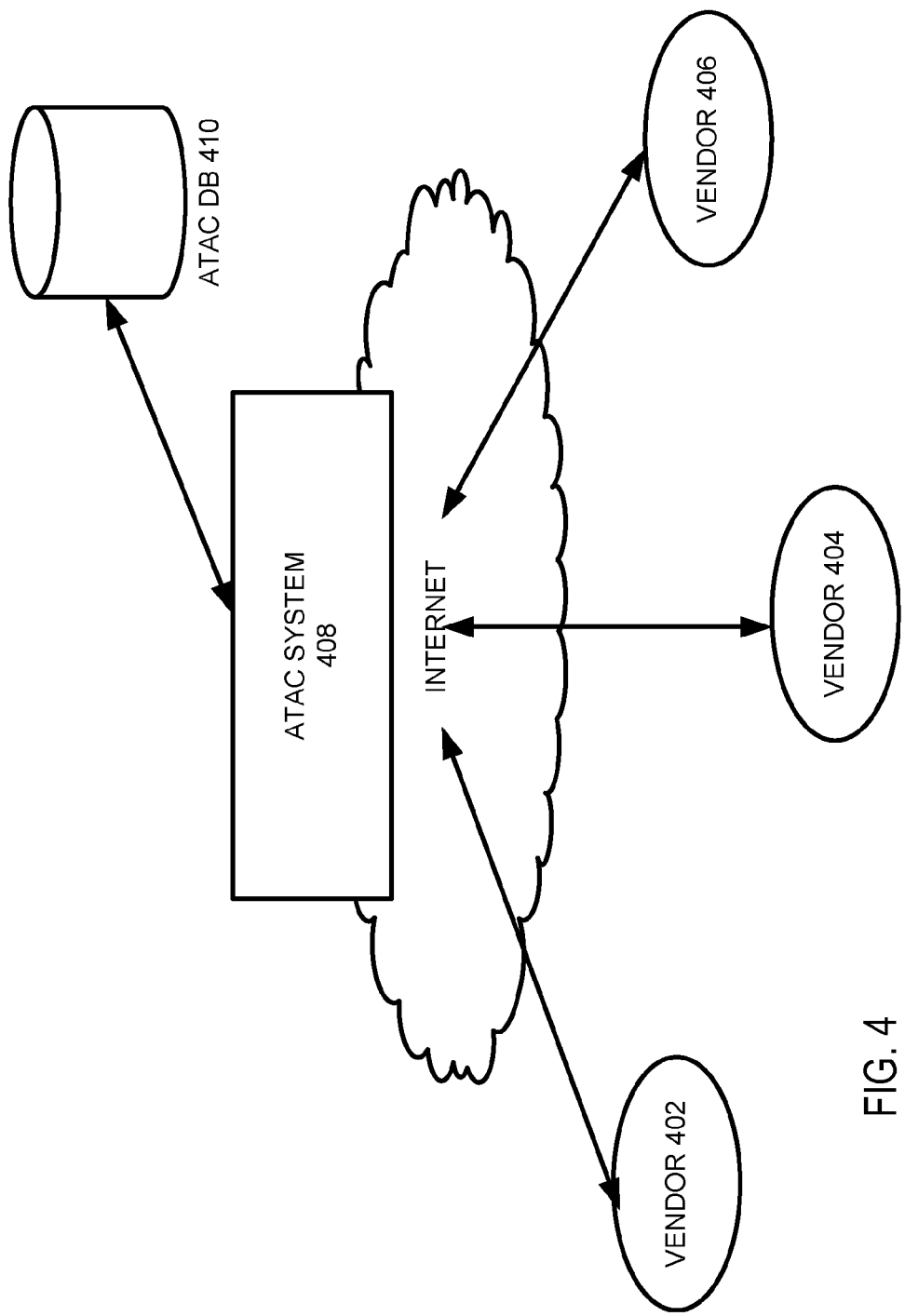
FIG. 4 shows, in an embodiment, a simplified diagram of an overall environment of the ATAC system in relation to a database.

FIG. 4 shows, in an embodiment, a simplified diagram of an overall environment of the ATAC system in relation to a database. Consider the situation wherein, for example, vendors 402, 404 and 406 are collecting test results using an ATAC system 408 and are sending the data upstream to an ATAC collection database 410 via ATAC system 408. The data are stored on ATAC collection database 408 and are available for future analysis. With the plethora of data that are stored, a data analysis module is needed to manipulate the test data collected into readable reports and charts.

Figure 5:
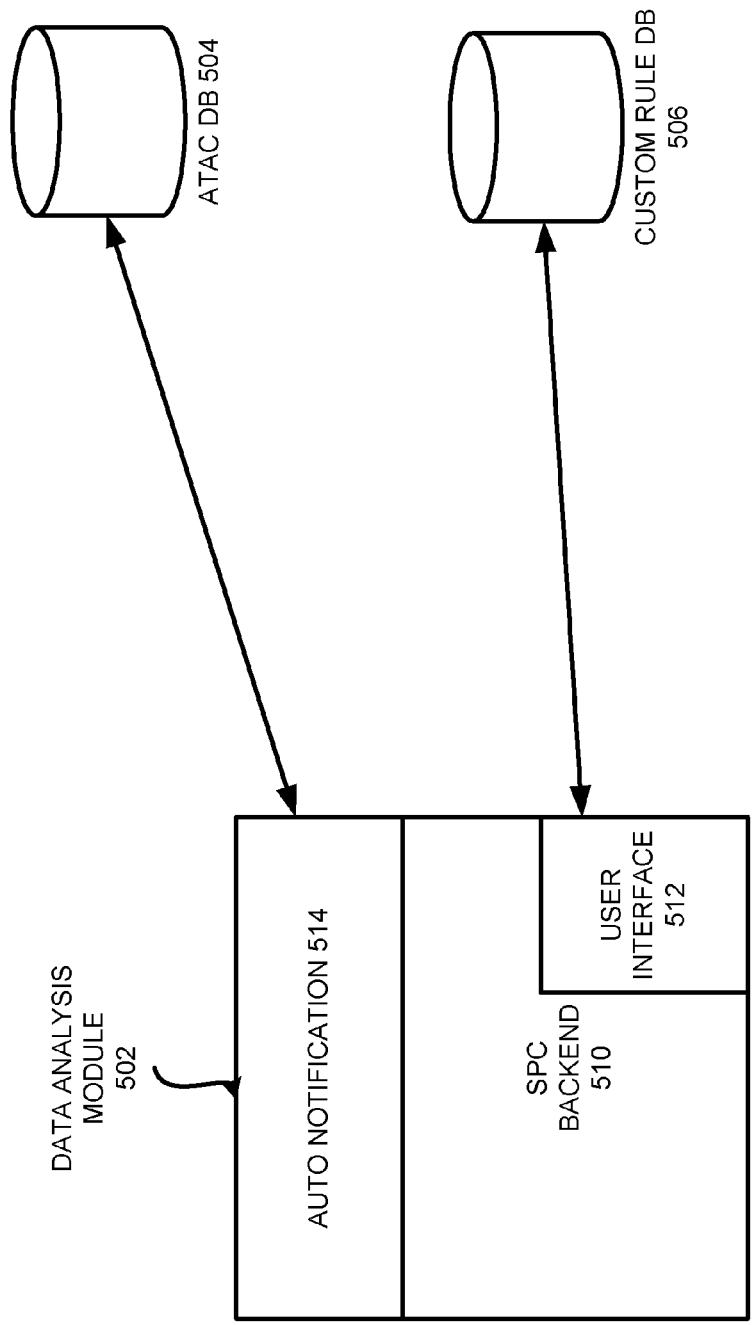
FIG. 5 shows, in an embodiment, a block diagram of a data analysis module.

FIG. 5 shows, in an embodiment, a block diagram of a data analysis module. A data analysis module 502 is connected to an ATAC collection database 504. In an embodiment, a custom rules database 506 may also be connected to data analysis module 502.

In an embodiment, data analysis 502 may include a statistical process control (SPC) backend 510. With SPC backend, statistical analysis may be performed on the test data stored on ATAC collection database 504. To provide the user with a user-friendly interface for retrieving and analyzing data, data analysis module 502 may include user interface 512. With user interface 512, the user may access SPC backend 510 to query the test data stored on ATAC collection database 504. The result of the query may be presented in user-friendly reports and charts that may be configured by the user by accessing custom rules database 506.

Custom rules database 506 may include, in an embodiment, a file storage area and a SQL database. The file storage area may include rules on how reports and charts may be created and customized. By using custom rules database 506 a user may create templates of charts and reports that the user may save for later application. In another embodiment, custom rules database 506 may also include a database where notification information may reside.

In an embodiment, the user may want to be notified when certain activities occur. By using an auto notification 514 of data analysis module 502, the user may be notified of certain activities. To define the rules for notification, the auto notification may access custom rules database 506. As mentioned above, custom rules database 506 may include notification rules that allow a user to configure the conditions under which the user is notified by the system that changes have occurred in the test results. In an example, a user may set an auto notification rule where the system may notify the user when the test data for a component for a transfer module change by more than a pre-determined percentage. When this auto notification rule is triggered, the user is notified. In an embodiment, a report may be generated using a pre-defined template showing the change in the test data.

Figure 6:
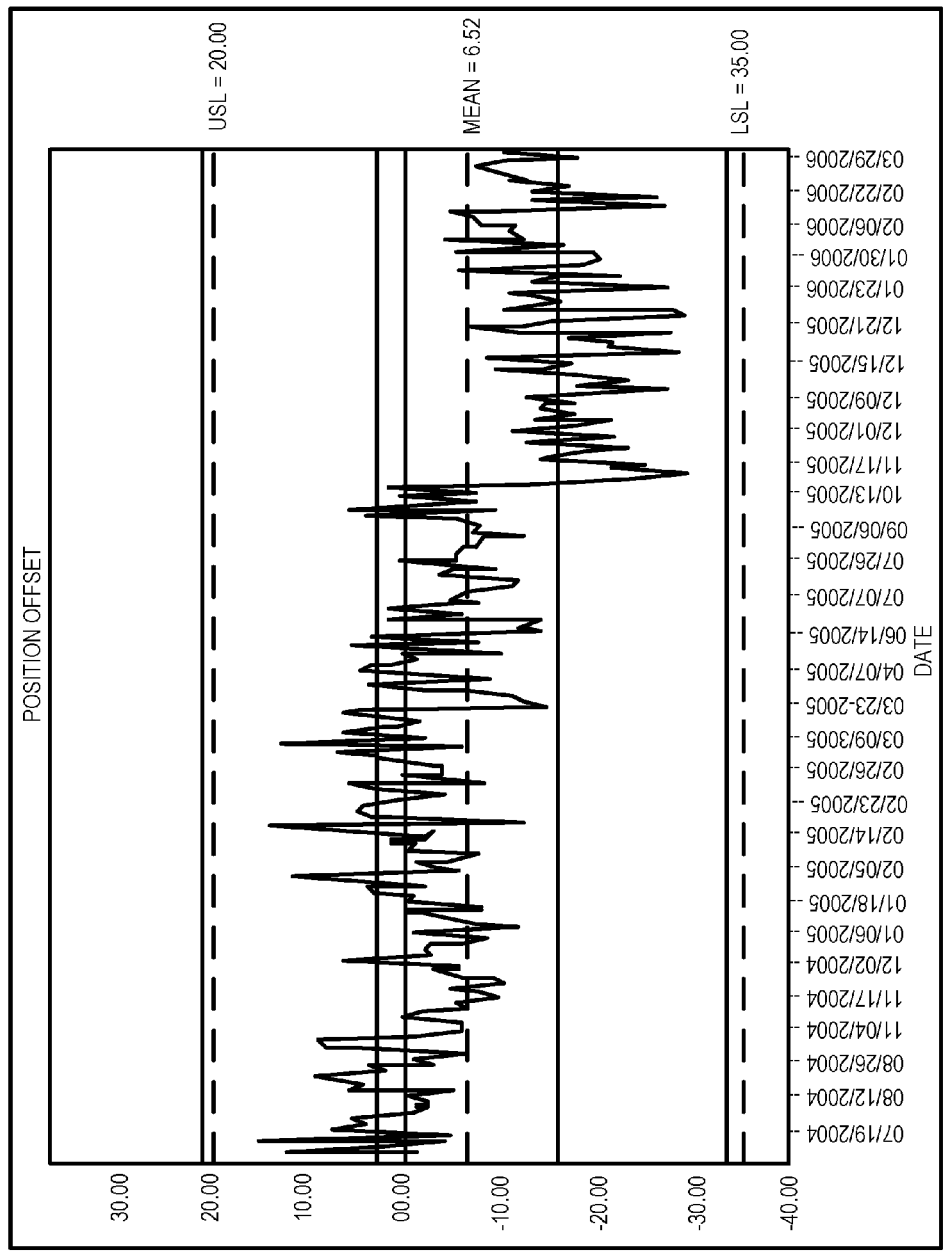
FIGS. 6 and 7 show, in an embodiment, examples of a chart generated by the data analysis module.
Figure 7:
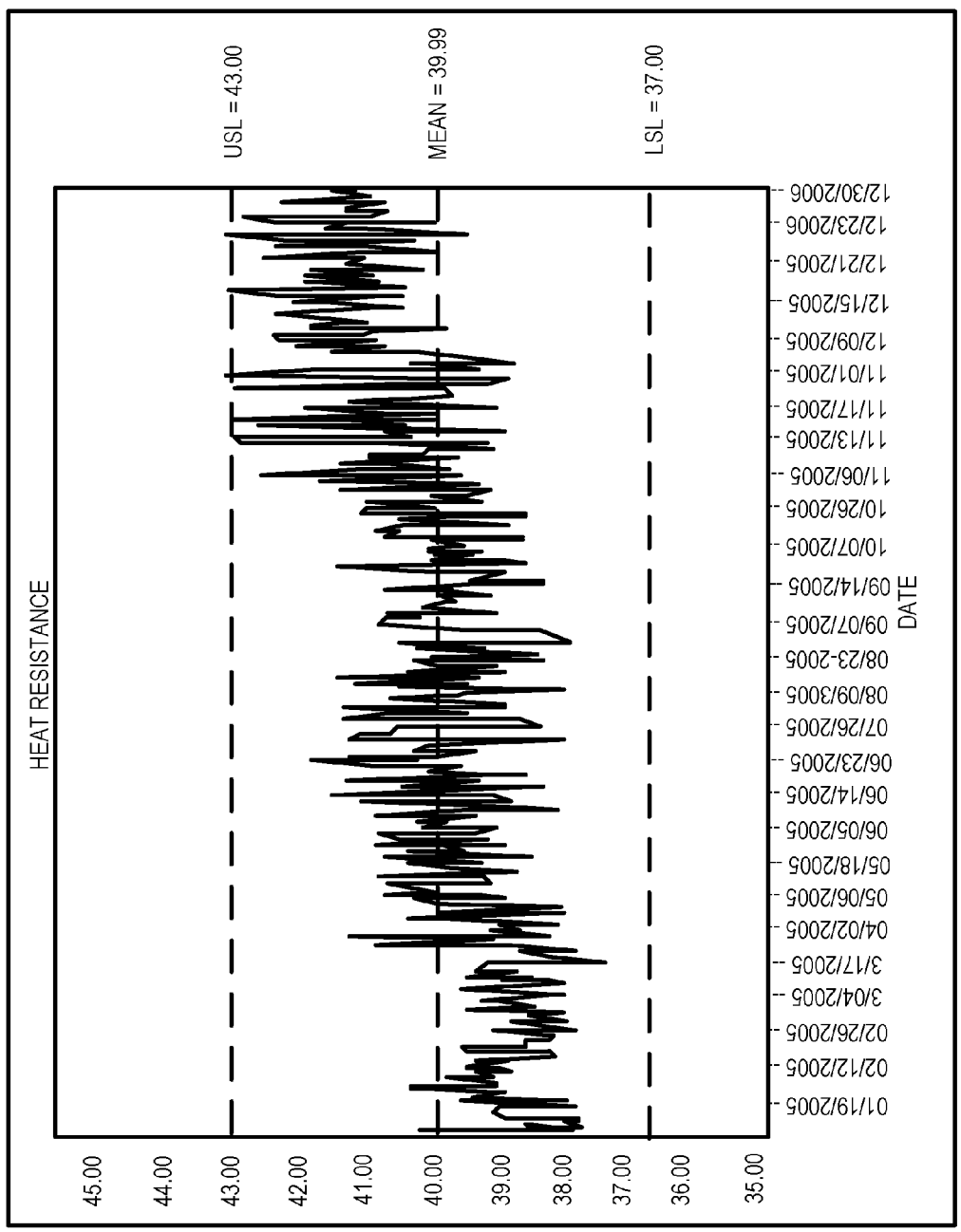

FIGS. 6 and 7 show, in an embodiment, types of charts that may be generated. FIG. 6 shows a graph of a component with position offset. In this example, an event occurred during the month of October 2005 that caused the trend of the position offset to change. With a data analysis module, a user may employ the auto notification feature to alert him to changes similar to those shown in FIG. 6, thus detecting shift in manufacturing processing.

In another example, FIG. 7 shows an example of a chart of heat resistance values of a component. In this example, the trend of the heat resistance values is slowly creeping upward. On a day-to-day basis, the user may be unable to identify the upward trend; however, with the data analysis module, the user may plot the heat resistance values on a graph and quickly identify the trend. Also, the user may be able to employ the current trend to predict upcoming test results and may be able to utilize the prediction to prevent failure.

Both FIGS. 6 and 7 show example of how the data analysis module may be employed to detect changes that may cause problem before the components are sent to the customer's site. In an embodiment, with an efficient and effective analysis tool, like the data analysis module, manufacturers may be able to prevent not only failures from occurring but may also be able to modify the test standards in order to provide better control over the test results. In an example, if the upper and lower limit of a range can be effectively narrow so that the components are better made, then less hardware failure may occur at customer's sites.

Figure 8:
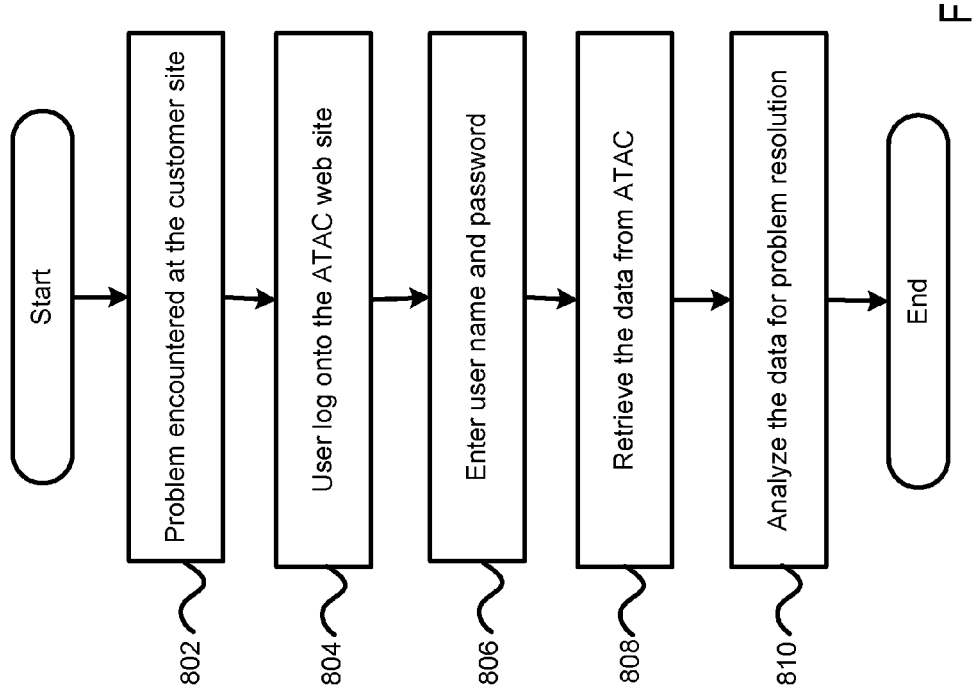
FIG. 8 shows, in an embodiment, a simplified flowchart for using the ATAC system to perform problem resolution.

The following example illustrates how problem resolution may be performed using the test data that have been stored on the ATAC collection database, where the data are easily accessible to those who are authorized to view the test data. FIG. 8 shows, in an embodiment, a simplified flowchart for using the ATAC system to perform problem resolution. Consider the situation wherein, for example, a plasma cluster tool is being set up at a customer's site by a field engineer. At a first step 802, a problem with the plasma cluster tool may be encountered at the customer site. In an example, upon setup, the plasma cluster tool does not pass a VCI no-plasma test. A VCI is a device on a processing module which monitors the voltage control scheme of a processing module. The VCI no-plasma test may require that the slope be within a set range. However, test results at the customer site may be at the lower end of the spectrum.

At a next step 804, a user (e.g., field engineer) may log onto the ATAC web site. At a next step 806, the user may enter user name and password to access the ATAC web site. At a next step 808, the user may retrieve the test results from ATAC. At a next step 810, the user may perform problem resolution by analyzing the test data. By using a data analysis module, the user may be able to query the ATAC collection database to gather the test data for the VCI no-plasma test. Upon analysis, the field engineer may be able to detect that during testing, the slope was already trending toward the lower end of the spectrum (even though it was within the range). Also, the field engineer may analyze the test data associated with the same configuration and may be able to determine the time when the slope started to trend downward. Based on the data, the field engineer may be able to trace the problem to an event that happened during that time. Upon further investigation, the problem may be traced back to a supplier who was supplying the electrodes. With the data readily available via the ATAC web service, the field engineer may be able to quickly pinpoint the problem. In the past, the analysis may have taken weeks or months.

As can be appreciated from the embodiments of the invention, the ATAC system provides for a standard test framework, thereby significantly reducing the possibility that testing may be performed inaccurately. By standardizing the testing, manufacturers may now have the assurance that the plasma processing systems set up at the customers' sites have been tested according to testing methodology and specifications approved by the manufacturers. In addition, the ATAC system allows for near real-time unload of data; thus, those who are authorized to access the data now have ready access to the test results to perform data analysis and troubleshooting.

While this invention has been described in terms of several embodiments, there are alterations, permutations, and equivalents, which fall within the scope of this invention. Also, the title, summary, and abstract are provided herein for convenience and should not be used to construe the scope of the claims herein. Further, in this application, a set of "n" refers to one or more "n" in the set. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for testing a first component configured to be installed in a plasma processing system that is controlled during production with a production system control software, comprising:

providing an ATAC (Automated Test and Characterization) fixture, said ATAC fixture including at least:
  a first system control software package ("first SCS") that is representative of said production system control software,
  a data manager module configured to obtain specification data from a first database over a computer network,
  a test manager module configured to execute, using said first SCS, a set of tests designed to test said component,
  a SCS interface engine configured to provide at least said set of tests to said first SCS, and
  a data analysis module configured to provide computer-implemented data analysis tool to a user for analyzing test data obtained from said testing said first component; and coupling said ATAC fixture to said first component to enable said first SCS in said ATAC fixture to test said first component utilizing said set of tests and at least a portion of said specification data, wherein missing components of said plasma processing system which are not present while testing said first component are stubbed out to simulate said missing components, thereby permitting said first component to be tested in a simulated environment using said first SCS as if said missing components are present while testing said first component.

2. The method of claim 1 wherein said computer network represents the Internet.

3. The method of claim 1 wherein said specification data represents data that is employed by vendors for testing components that are the same type as said first component irrespective of which of said vendors actually performs said testing of said components that are the same type as said first component.

4. The method of claim 1 wherein said first database is rendered accessible to said test manager module using a web server.

5. The method of claim 1 wherein said specification data is provided by a manufacturer of said plasma processing system for all vendors testing components that are the same type as said first component irrespective of which of said vendors actually performs said testing of said components that are the same type as said first component.

6. The method of claim 1 wherein further comprising obtaining test results, using said data manager module, from said testing of said first component and uploading said test results to a second database via the Internet for subsequent analysis.

7. The method of claim 6 wherein said test results are stored using a predefined format that is consistent for all vendors testing components that are the same type as said first component irrespective of which of said vendors actually performs said testing of said components that are the same type as said first component.

8. The method of claim 1 wherein said first SCS represents an exact copy of said production system control software.

9. The method of claim 1 wherein said data analysis module is further configured to monitor said test data for a condition that triggers a notification event.

10. The method of claim 9 wherein said data analysis module further includes an auto-notification module configured to transmit a notification if said condition that triggers said notification event is met.

11. A test fixture configured for testing a first component that is configured to be installed in a plasma processing system that is controlled during production with a production system control software, said test fixture comprising:
   a first system control software package ("first SCS") that is representative of said production system control software;
   a data manager module configured to obtain specification data from a first database over a computer network;
   a test manager module configured to execute, using said first SCS, a set of tests designed to test said component;
   a SCS interface engine configured to provide at least said set of tests to said first SCS; and
   a data analysis module configured to provide computer-implemented data analysis tool to a user for analyzing test data obtained from said testing said first component,
   wherein said test fixture, when coupled to said first component, is configured to enable said first SCS in said test fixture to test said first component utilizing said set of tests and at least a portion of said specification data, and
   wherein missing components of said production plasma processing system which are not present while testing said first component are stubbed out to simulate said missing components, thereby permitting said first component to be tested in a simulated environment using said first SCS as if said missing components are present while testing said first component.

12. The test fixture of claim 11 wherein said computer network represents the Internet.

13. The test fixture of claim 11 wherein said specification data represents data that is employed by vendors for testing components that are the same type as said first component irrespective of which of said vendors actually performs said testing of said components that are the same type as said first component.

14. The test fixture of claim 11 wherein said first database is rendered accessible to said test manager module using a web server.

15. The test fixture of claim 11 wherein said specification data is provided by a manufacturer of said plasma processing system for all vendors testing components that are the same type as said first component irrespective of which of said vendors actually performs said testing of said components that are the same type as said first component.

16. The test fixture of claim 11 wherein said data manager module is further configured to obtain test results from said testing of said first component and uploading said test results to a second database via the Internet for subsequent analysis.

17. The test fixture of claim 16 wherein said test results are stored using a predefined format that is consistent for all vendors testing components that are the same type as said first component irrespective of which of said vendors actually performs said testing of said components that are the same type as said first component.

18. The test fixture of claim 11 wherein said first SCS represents an exact copy of said production system control software.

19. The test fixture of claim 11 wherein said data analysis module is further configured to monitor said test data for a condition that triggers a notification event.

20. The test fixture of claim 19 wherein said data analysis module further includes an auto-notification module configured to transmit a notification if said condition that triggers said notification event is met.

21. A method for testing a first component configured to be installed in a plasma processing system that is controlled during production with a production system control software, comprising:
   providing an ATAC (Automated Test and Characterization) fixture, said ATAC fixture being configured to simulate a plasma processing system such that said first component can be tested with a set of tests and specification data obtained by said ATAC fixture via a computer network from a database;
   coupling said ATAC fixture to said first component to facilitate said testing of said first component;
   testing said first component with said set of tests and said specification data; and
   analyzing test data obtained from said testing said first component using said ATAC fixture to detect a condition that triggers a notification,
   wherein missing components of said plasma processing system which are not present while testing said first component are stubbed out to simulate said missing components, thereby permitting said first component to be tested in a simulated environment as if said missing components are present while testing said first component.

22. The method of claim 21 wherein said computer network represents the Internet.

23. The method of claim 21 wherein said first database is rendered accessible to a test manager module using a web server.

* * * * *